United States Patent
Sekiya

(10) Patent No.: US 11,011,393 B2
(45) Date of Patent: May 18, 2021

(54) CUTTING APPARATUS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 120 days.

(21) Appl. No.: 16/539,544

(22) Filed: Aug. 13, 2019

(65) Prior Publication Data

US 2020/0058524 A1 Feb. 20, 2020

(30) Foreign Application Priority Data

Aug. 15, 2018 (JP) .............................. JP2018-152885

(51) Int. Cl.
| | | |
|---|---|---|
| *H01L 21/67* | (2006.01) | |
| *B26D 3/06* | (2006.01) | |
| *B62D 3/06* | (2006.01) | |
| *B26D 1/14* | (2006.01) | |
| *B26D 7/08* | (2006.01) | |
| *B26D 5/00* | (2006.01) | |

(52) U.S. Cl.
CPC ........ *H01L 21/67092* (2013.01); *B26D 3/065* (2013.01); *H01L 21/67253* (2013.01); *B26D 1/141* (2013.01); *B26D 5/005* (2013.01); *B26D 7/088* (2013.01)

(58) Field of Classification Search
CPC ........ H01L 21/67092; H01L 21/67253; B26D 3/065; B26D 1/141; B26D 7/088; B26D 5/005
USPC .......................................................... 83/875
See application file for complete search history.

(56) References Cited

U.S. PATENT DOCUMENTS

| | | | | |
|---|---|---|---|---|
| 7,316,174 | B2* | 1/2008 | Sekiya | B28D 5/024 125/13.01 |
| 2004/0004713 | A1* | 1/2004 | Go | H01L 21/67288 356/237.1 |
| 2006/0112802 | A1* | 6/2006 | Fujinami | B28D 5/024 83/310 |
| 2007/0028734 | A1* | 2/2007 | Sekiya | H01L 21/67259 83/72 |
| 2010/0050848 | A1* | 3/2010 | Elhaus | B27B 5/075 83/863 |
| 2010/0139465 | A1* | 6/2010 | Christian | B26D 5/34 83/23 |

(Continued)

FOREIGN PATENT DOCUMENTS

| | | | |
|---|---|---|---|
| JP | 2000252240 A | * | 9/2000 |
| JP | 2005046979 A | | 2/2005 |

*Primary Examiner* — Kenneth E Peterson
*Assistant Examiner* — Nhat Chieu Q Do
(74) *Attorney, Agent, or Firm* — Greer Burns & Crain Ltd.

(57) ABSTRACT

A cutting apparatus includes a processing feed direction determining mechanism. The processing feed direction determining mechanism includes an imaging unit that images a region including a cut groove and a recording unit that records chipping data of the imaged cut groove. The recording unit records first chipping data of a cut groove formed by cutting a workpiece from a first direction, second chipping data of a cut groove formed by cutting the workpiece from a direction opposite from the first direction, third chipping data of a cut groove formed by cutting the workpiece from a second direction orthogonal to the first direction, and fourth chipping data of a cut groove formed by cutting the workpiece from a direction opposite from the second direction.

5 Claims, 8 Drawing Sheets

(56) References Cited

U.S. PATENT DOCUMENTS

| | | | |
|---|---|---|---|
| 2015/0273730 A1* | 10/2015 | Katagiri | B26D 3/06 |
| | | | 83/875 |
| 2016/0136843 A1* | 5/2016 | Katoh | H01L 21/681 |
| | | | 125/14 |
| 2016/0189989 A1* | 6/2016 | Hanajima | H01L 21/67253 |
| | | | 83/520 |
| 2016/0284611 A1* | 9/2016 | Sekiya | B28D 5/0064 |
| 2016/0297091 A1* | 10/2016 | Komatsu | H01L 21/78 |
| 2017/0014947 A1* | 1/2017 | Odagiri | B23K 26/032 |
| 2017/0186656 A1* | 6/2017 | Iwamoto | H01L 21/68764 |

\* cited by examiner

FIG.7

| | CHIPPING SIZE | | |
|---|---|---|---|
| CUTTING DIRECTION | ~5μm | 5~10μm | 10~15μm |
| FURST DIRECTION | 8 CHIPPINGS | 0 CHIPPING | 0 CHIPPING |
| OPPOSITE DIRECTION FROM FIRST DIRECTION | 0 CHIPPING | 0 CHIPPING | 0 CHIPPING |
| SECOND DIRECTION | 1 CHIPPING | 2 CHIPPINGS | 1 CHIPPING |
| OPPOSITE DIRECTION FROM SECOND DIRECTION | 0 CHIPPING | 0 CHIPPING | 0 CHIPPING | ns
CUTTING APPARATUS

BACKGROUND OF THE INVENTION

Field of the Invention

The present invention relates to a cutting apparatus that cuts a workpiece by a cutting blade rotated at high speed.

Description of the Related Art

A wafer having a plurality of devices such as integrated circuits (ICs), large-scale integrations (LSIs), or the like demarcated by a plurality of intersecting planned dividing lines and formed on a top surface thereof is formed to a desired thickness by grinding the undersurface of the wafer by a grinding apparatus. The wafer is thereafter divided into individual device chips by a cutting apparatus. Each of the divided device chips is used in an electric apparatus such as a mobile telephone, a personal computer, or the like.

The cutting apparatus includes: a chuck table 80 having a holding surface holding a workpiece 82; a cutting unit 84 having a rotatable cutting blade that cuts the workpiece held on the chuck table; a cutting water supplying mechanism that supplies cutting water to the cutting blade and the workpiece; a processing feed mechanism 86 that processing-feeds the chuck table and the cutting unit relative to each other in an X-axis direction parallel with the holding surface; and an indexing feed mechanism 88 that indexing-feeds the chuck table and the cutting unit relative to each other in a Y-axis direction parallel with the holding surface and orthogonal to the X-axis direction. The cutting apparatus can cut the wafer with high precision (see Japanese Patent Laid-Open No. 2005-46979, for example).

SUMMARY OF THE INVENTION

However, depending on the relative processing feed direction of the cutting unit and the chuck table, size and quantity or the like of chippings occurring in the device chips may differ, which causes a difference in quality of the device chips.

It is accordingly an object of the present invention to provide a cutting apparatus that can produce device chips of excellent quality.

In accordance with an aspect of the present invention, there is provided a cutting apparatus including: a chuck table having a holding surface holding a workpiece; a cutting unit having a rotatable cutting blade that cuts the workpiece held on the chuck table; a cutting water supplying mechanism that supplies cutting water to the cutting blade and the workpiece; a processing feed mechanism that processing-feeds the chuck table and the cutting unit relative to each other in an X-axis direction parallel with the holding surface; an indexing feed mechanism that indexing-feeds the chuck table and the cutting unit relative to each other in a Y-axis direction parallel with the holding surface and orthogonal to the X-axis direction; and a processing feed direction determining mechanism; the processing feed direction determining mechanism including an imaging unit that images a region including a cut groove and recording means recording chipping data of the imaged cut groove, and the recording means recording first chipping data of a cut groove formed by cutting the workpiece from a first direction, second chipping data of a cut groove formed by cutting the workpiece from a direction opposite from the first direction, third chipping data of a cut groove formed by cutting the workpiece from a second direction intersecting the first direction, and fourth chipping data of a cut groove formed by cutting the workpiece from a direction opposite from the second direction.

Preferably, the imaging unit images a cut groove formed on an undersurface of the workpiece by light having a wavelength passing through the workpiece, and the recording means records first undersurface chipping data of an undersurface side of the cut groove formed by cutting the workpiece from the first direction, second undersurface chipping data of an undersurface side of the cut groove formed by cutting the workpiece from the direction opposite from the first direction, third undersurface chipping data of an undersurface side of the cut groove formed by cutting the workpiece from the second direction intersecting the first direction, and fourth undersurface chipping data of an undersurface side of the cut groove formed by cutting the workpiece from the direction opposite from the second direction. Preferably, the processing feed determining mechanism includes determining means, and the determining means determines directions in which to form a cut groove by comparing the first chipping data, the second chipping data, the third chipping data, and the fourth chipping data recorded in the recording means.

Preferably, the processing feed determining mechanism includes determining means, and the determining means determines directions in which to form a cut groove by comparing the first undersurface chipping data, the second undersurface chipping data, the third undersurface chipping data, and the fourth undersurface chipping data in addition to the first chipping data, the second chipping data, the third chipping data, and the fourth chipping data recorded in the recording means. Preferably, the processing feed determining mechanism includes at least one of display means displaying the chipping data and output means outputting the chipping data. The chipping data suitably includes size and quantity of chippings. The chipping data conveniently includes an image.

According to the present invention, it is possible to determine directions in which to form cut grooves by comparing the first to fourth chipping data, and produce device chips of excellent quality by cutting a wafer from the appropriate directions.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 7 is a table depicting an example of chipping data output by output means.

DETAILED DESCRIPTION OF THE PREFERRED EMBODIMENT

Figure 1:
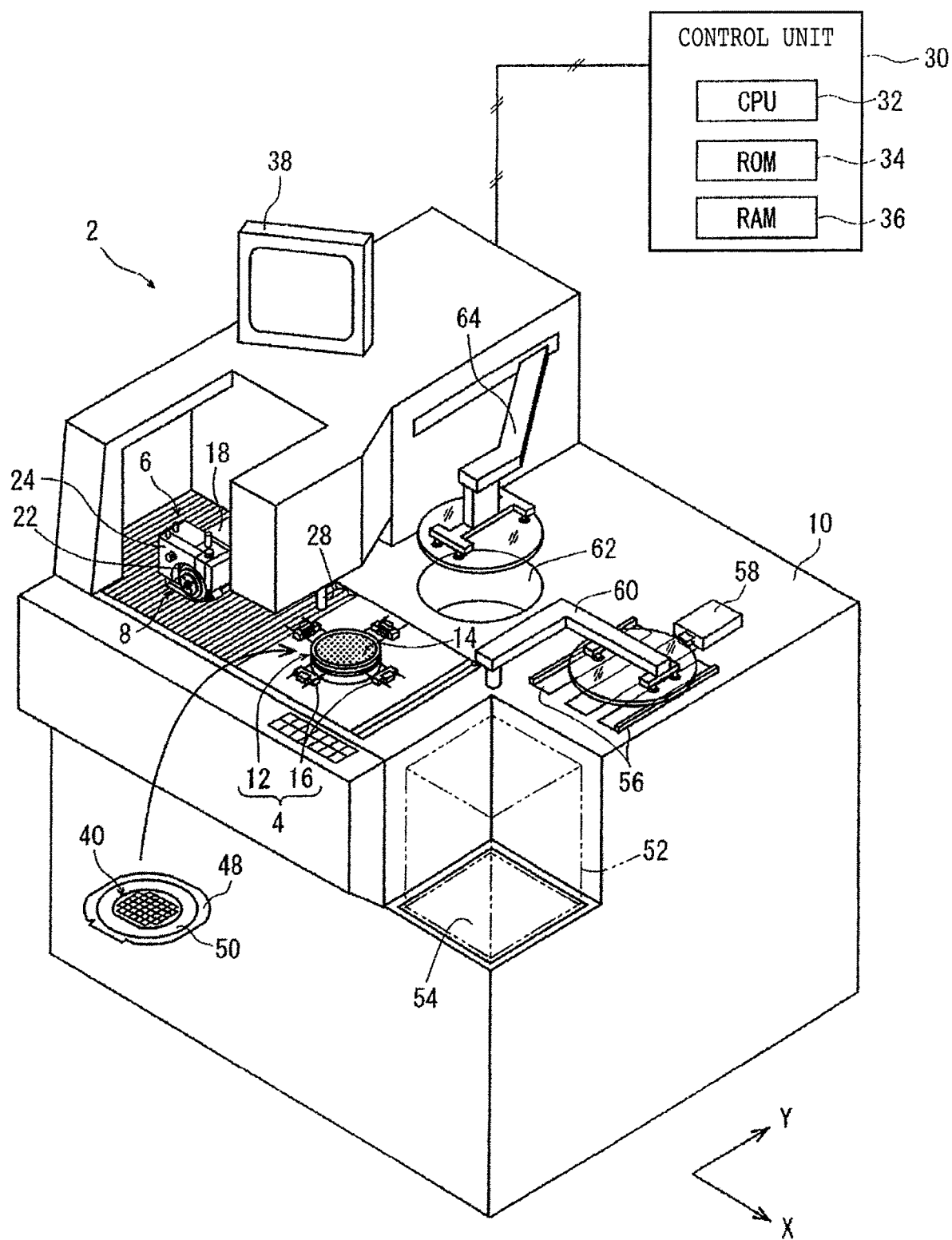
FIG. 1 is a perspective view of a cutting apparatus configured according to the present invention.

A preferred embodiment of a cutting apparatus configured according to the present invention will hereinafter be described with reference to the drawings. A cutting apparatus 2 depicted in FIG. 1 includes: a chuck table 4 having a holding surface holding a workpiece; a cutting unit 6 having a rotatable cutting blade that cuts the workpiece held on the chuck table 4; a cutting water supplying mechanism 8 that supplies cutting water to the cutting blade and the workpiece; a processing feed mechanism (not depicted) that processing-feeds the chuck table 4 and the cutting unit 6 relative to each other in an X-axis direction (direction indicated by an arrow X in FIG. 1) parallel with the holding surface; an indexing feed mechanism (not depicted) that indexing-feeds the chuck table 4 and the cutting unit 6 relative to each other in a Y-axis direction (direction indicated by an arrow Y in FIG. 1) parallel with the holding surface and orthogonal to the X-axis direction; and a processing feed direction determining mechanism. Incidentally, a plane defined by the X-axis direction and the Y-axis direction is substantially horizontal.

The chuck table 4 includes a chuck table 12 mounted on an apparatus housing 10 so as to be rotatable and movable in the X-axis direction. The chuck table 12 is rotated about an axis extending in a vertical direction by a motor (not depicted) for the chuck table, the motor being included in the apparatus housing 10. A porous circular suction chuck 14 connected to suction means (not depicted) is disposed on an upper end part of the chuck table 12. The chuck table 12 sucks and holds the workpiece placed on the top surface of the suction chuck 14 by generating a suction force in the suction chuck 14 by the suction means. Thus, in the present embodiment, the holding surface holding the workpiece is formed by the top surface of the suction chuck 14. In addition, a plurality of clamps 16 are arranged on the periphery of the chuck table 12 at intervals in a circumferential direction.

Figure 2:
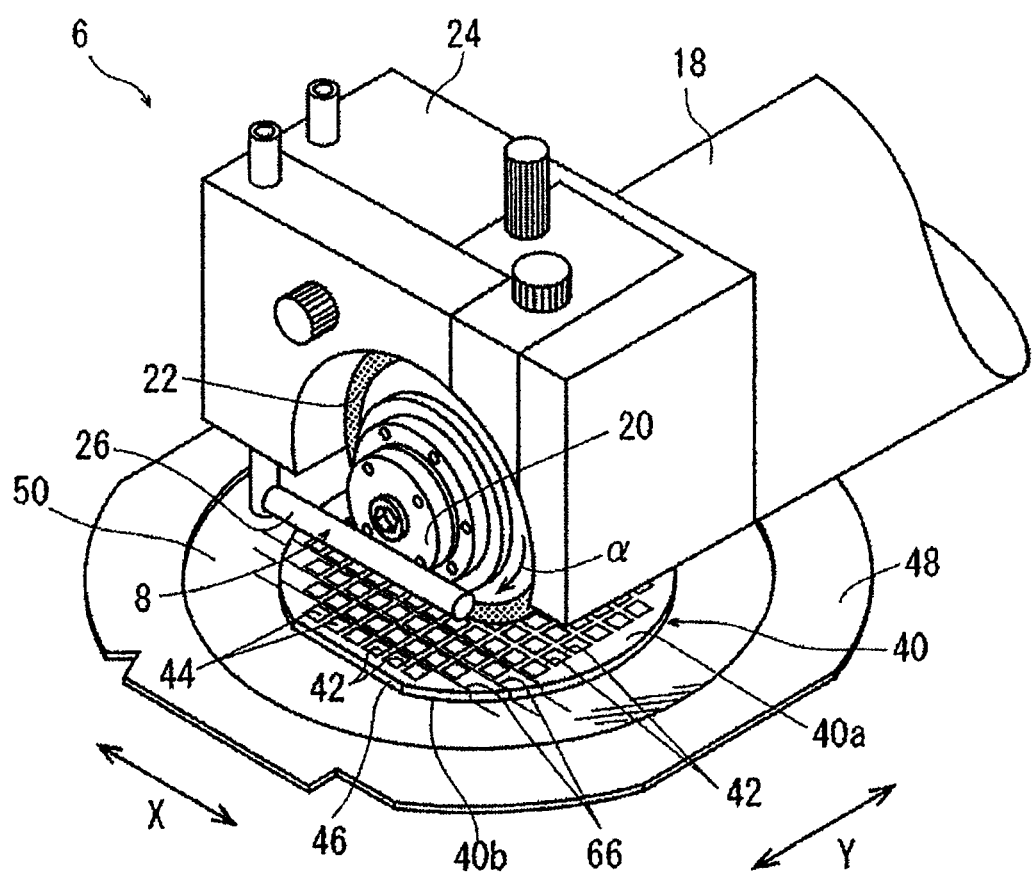
FIG. 2 is an enlarged perspective view of a cutting unit depicted in FIG. 1.

Making description with reference to FIG. 2 in conjunction with FIG. 1, the cutting unit 6 includes a spindle housing 18 supported by the apparatus housing 10 so as to be movable in the Y-axis direction and capable of being raised and lowered; a spindle 20 supported by the spindle housing 18 so as to be rotatable with the Y-axis direction as an axis thereof; a cutting blade 22 fixed to an end of the spindle 20; a motor (not depicted) that rotates the cutting blade 22 together with the spindle 20 in a direction indicated by an arrow a in FIG. 2; and a blade cover 24 fitted to an end of the spindle housing 18.

As depicted in FIG. 2, the cutting water supplying mechanism 8 includes a cutting water supplying nozzle 26 attached to the blade cover 24. While a pair of cutting water supplying nozzles 26 extending along the side surface of the cutting blade 22 is provided on both sides of the cutting blade 22, FIG. 2 depicts only the cutting water supplying nozzle 26 on one side. The cutting water supplying nozzle 26 is connected to a cutting water supply source (not depicted). When the cutting blade 22 performs cutting processing on the workpiece held on the chuck table 12, the cutting water supplying nozzle 26 jets cutting water supplied from the cutting water supply source from a plurality of jetting ports (not depicted) of the cutting water supplying nozzle 26 to the cutting blade 22 and the workpiece.

The processing feed mechanism in the present embodiment includes a ball screw (not depicted) coupled to the chuck table 12 and extending in the X-axis direction and a motor (not depicted) rotating the ball screw. The processing feed mechanism processing-feeds the chuck table 12 relative to the cutting unit 6 in the X-axis direction.

The indexing feed mechanism in the present embodiment includes a ball screw (not depicted) coupled to the spindle housing 18 and extending in the Y-axis direction and a motor (not depicted) rotating the ball screw. The indexing feed mechanism indexing-feeds the spindle housing 18 relative to the chuck table 4 in the Y-axis direction. In addition, the spindle housing 18 is cutting-fed (raised or lowered) in the vertical direction by cutting feed means including a ball screw (not depicted) extending in the vertical direction and a motor (not depicted) rotating the ball screw.

The processing feed direction determining mechanism includes an imaging unit 28 that images a region including a cut groove formed in the workpiece by the cutting blade 22. The imaging unit 28 disposed above the chuck table 12 includes: an ordinary imaging element (charge-coupled device (CCD)) that images the workpiece by visible rays; infrared irradiating means, for example, applying light having a wavelength passing through the workpiece; an optical system that captures infrared rays applied by the infrared irradiating means; and an imaging element (infrared CCD) that outputs an electric signal corresponding to the infrared rays captured by the optical system (none are depicted).

As depicted in FIG. 1, a control unit 30 that controls operation of the cutting apparatus 2 is electrically connected to the imaging unit 28. The control unit 30 is constituted of a computer. The control unit 30 includes: a central processing unit (CPU) 32 that performs arithmetic processing according to a control program, a read-only memory (ROM) 34 that stores the control program and the like, and a readable and writable random access memory (RAM) 36 that stores an operation result and the like.

The RAM 36 of the control unit 30 functions as recording means recording chipping data of cut grooves imaged by the imaging unit 28 (data on chips occurring on both sides of the cut grooves). In addition, the ROM 34 of the control unit 30 stores: a control program functioning as determining means determining a direction in which to form a cut groove in the workpiece on the basis of the chipping data recorded in the RAM 36; a control program functioning as output means outputting the chipping data recorded in the RAM 36; and the like. Further, display means 38 displaying the chipping data recorded in the RAM 36 is electrically connected to the control unit 30.

Thus, in addition to the imaging unit 28 and the recording means (RAM 36), the processing feed determining mechanism according to the present embodiment includes: the determining means determining a direction in which to form a cut groove in the workpiece on the basis of the chipping data recorded in the recording means; the display means 38 displaying the chipping data; and the output means outputting the chipping data.

Here, description will be made of the workpiece processed by the cutting apparatus 2. FIG. 1 and FIG. 2 depict also a disk-shaped wafer 40 as the workpiece. As depicted in FIG. 2, a top surface 40a of the wafer 40 is demarcated into a plurality of rectangular regions by planned dividing lines 42 in a lattice form, and a device 44 such as an IC, an LSI, or the like is formed in each of the plurality of rectangular regions. In addition, an orientation flat 46 indicating a crystal orientation is formed at a peripheral edge of the wafer 40. Incidentally, while an undersurface 40*b* of the wafer 40 is affixed to an adhesive tape 50 having a peripheral edge thereof fixed to an annular frame 48 in the present embodiment, the top surface 40*a* of the wafer 40 may be affixed to the adhesive tape 50.

The description of the cutting apparatus 2 will be continued with reference to FIG. 1. In the apparatus housing 10 of the cutting apparatus 2, a cassette 52 housing a plurality of wafers 40 each supported by an annular frame 48 via an adhesive tape 50 is mounted on a cassette mounting base 54 capable of being raised and lowered. The cassette mounting base 54 is raised and lowered by raising and lowering means (not depicted) having a ball screw and a motor. In addition, the cutting apparatus 2 further includes: carrying in/out means 58 taking out a wafer 40 before being cut from the cassette 52 and carrying out the wafer 40 before being cut to a temporary placing table 56, and carrying in an already cut wafer 40 placed on the temporary placing table 56 to the cassette 52; a first conveying mechanism 60 that conveys, to the chuck table 12, the wafer 40 before being cut which is carried out from the cassette 52 to the temporary placing table 56; cleaning means 62 cleaning an already cut wafer 40; and a second conveying mechanism 64 that conveys an already cut wafer 40 from the chuck table 12 to the cleaning means 62.

When the wafer 40 is divided into device chips of respective individual devices 44 by using the cutting apparatus 2, the wafer 40 is first sucked and held on the top surface of the chuck table 12 with the top surface 40*a* of the wafer 40 oriented upward, and the annular frame 48 is fixed by the plurality of clamps 16. Next, the imaging unit 28 images the wafer 40 from above. A planned dividing line 42 is aligned with the X-axis direction on the basis of an image of the wafer 40 imaged by the imaging unit 28, and the cutting blade 22 is positioned above the planned dividing line 42 aligned with the X-axis direction. Next, the cutting blade 22 is rotated by the motor together with the spindle 20.

Next, as depicted in FIG. 2, cutting processing that forms a cut groove 66 along the planned dividing line 42 is performed by lowering the spindle housing 18, making the cutting edge of the cutting blade 22 cut the planned dividing line 42 aligned with the X-axis direction from the top surface 40*a* to the undersurface 40*b* of the wafer 40, and processing-feeding the chuck table 12 relative to the cutting unit 6 in the X-axis direction. Next, the cutting processing is repeated while the cutting unit 6 is indexing-fed in the Y-axis direction with respect to the chuck table 12 by a Y-axis direction interval of the planned dividing line 42. Cut grooves 66 are thereby formed in all of planned dividing lines 42 aligned with the X-axis direction. Next, after the chuck table 12 is rotated by 90 degrees, the cutting processing is repeated while indexing feed is performed. Cut grooves 66 are thereby formed also in all of planned dividing lines 42 orthogonal to the planned dividing lines 42 in which the cut grooves 66 are previously formed. Thus, the wafer 40 is divided into the device chips of respective individual devices 44.

In the cutting apparatus 2 according to the present embodiment, before the above-described cutting processing is performed, test processing is performed as follows to determine an appropriate direction in which to form cut grooves 66. It is thereby possible to produce device chips of excellent quality with few chippings.

Figure 3A:
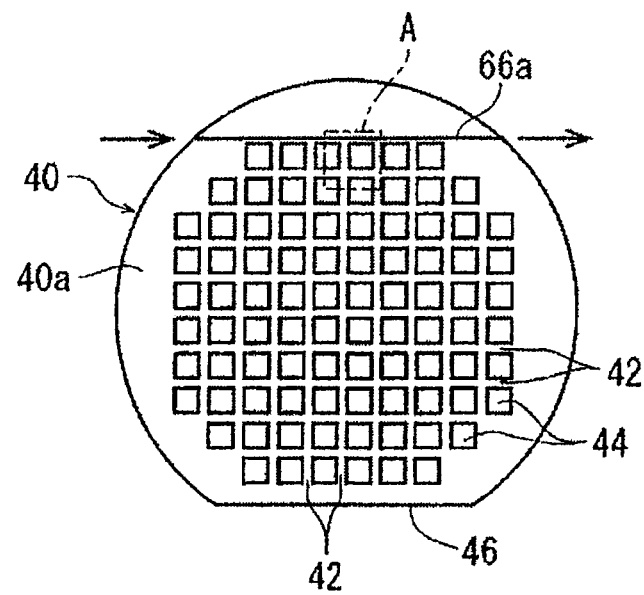
FIG. 3A is a plan view of a wafer in which a cut groove cut from a first direction is formed.
Figure 3B:
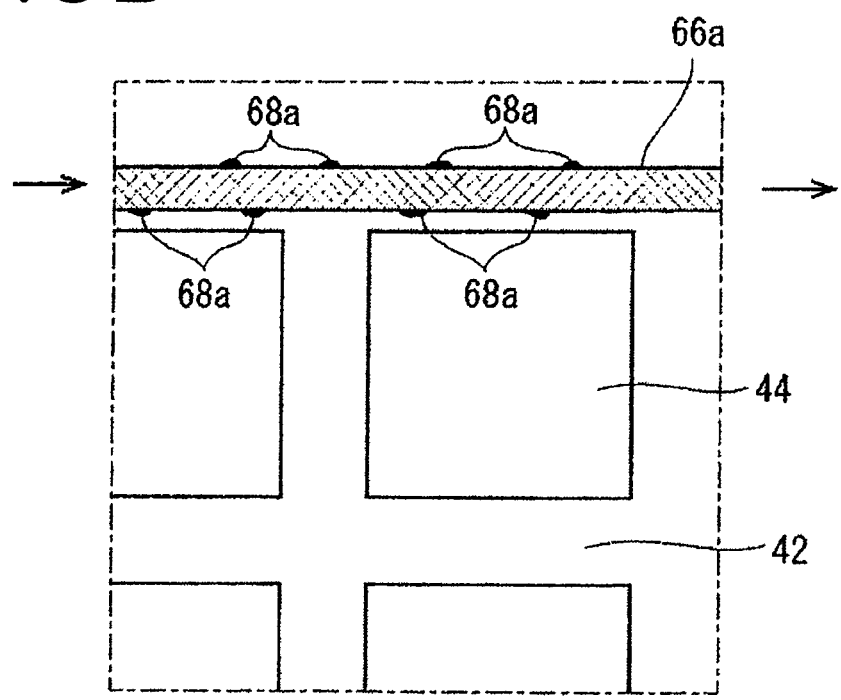
FIG. 3B is an enlarged view of a part A in FIG. 3A.

In the test processing, first chipping data of a cut groove formed by cutting the wafer 40 from a first direction is first recorded in the recording means. In the present embodiment, the orientation flat 46 is positioned on the lower side of FIG. 3A, and a cut groove 66*a* is formed by cutting the wafer 40 from the left side to the right side of FIG. 3A. Next, a region including the cut groove 66*a* formed on the top surface 40*a* of the wafer 40 is imaged by the imaging unit 28, an imaged image is analyzed, and chipping data (first chipping data) of the cut groove 66*a* is recorded in the RAM 36 as the recording means as depicted in FIG. 7. An example of chippings occurring when the cut groove 66*a* is formed is denoted by reference sign 68*a* in FIG. 3B.

The chipping data recorded in the recording means includes sizes and quantities of the chippings. When the chipping data is recorded in the recording means, the quantities of the chippings may be recorded for respective different chipping size such as less than 5 μm, between 5 μm inclusive and 10 μm exclusive, and equal to or more than 10 μm, or the like. As the quantities of the chippings, the quantities of chippings existing over a predetermined length (for example, 1 cm) may be measured, or the quantities of chippings may be measured over the entire length of the cut groove. In addition, as the chipping data, an image of a region including the cut groove may be recorded in the recording means.

Figure 4A:
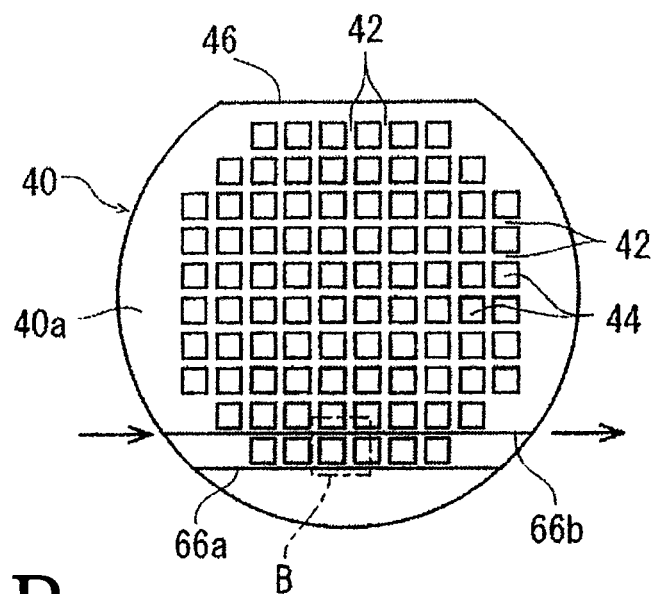
FIG. 4A is a plan view of the wafer in which a cut groove is further formed by cutting the wafer depicted in FIG. 3A from a direction opposite from the first direction.
Figure 4B:
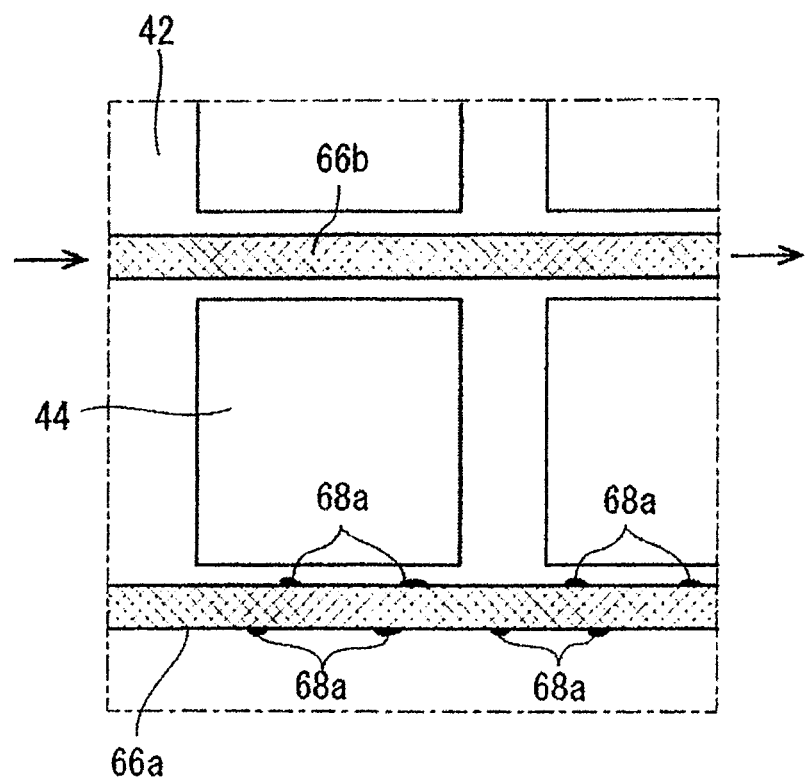
FIG. 4B is an enlarged view of a part B in FIG. 4A.

After the first chipping data is recorded, second chipping data of a cut groove formed by cutting the wafer 40 from a direction opposite from the first direction is recorded in the recording means. In the present embodiment, the wafer 40 is rotated by 180 degrees from the position depicted in FIG. 3A, the orientation flat 46 is positioned on the upper side of FIG. 4A, and a cut groove 66*b* is formed by cutting the wafer 40 from the left side to the right side of FIG. 4A. Next, a region including the cut groove 66*b* formed on the top surface 40*a* of the wafer 40 is imaged by the imaging unit 28, and chipping data (second chipping data) of the imaged cut groove 66*b* is recorded in the recording means as depicted in FIG. 7. In the present embodiment, as depicted in FIG. 4B, no chippings occur when the cut groove 66*b* is formed.

Figure 5A:
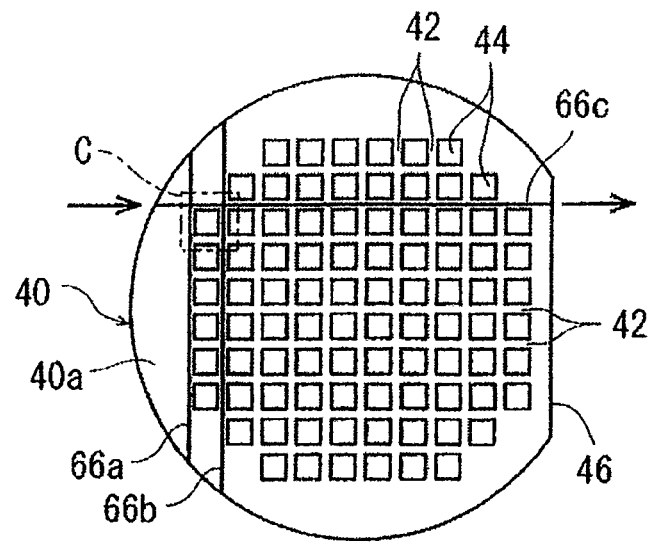
FIG. 5A is a plan view of the wafer in which a cut groove is further formed by cutting the wafer depicted in FIG. 4A from a second direction orthogonal to the first direction.
Figure 5B:
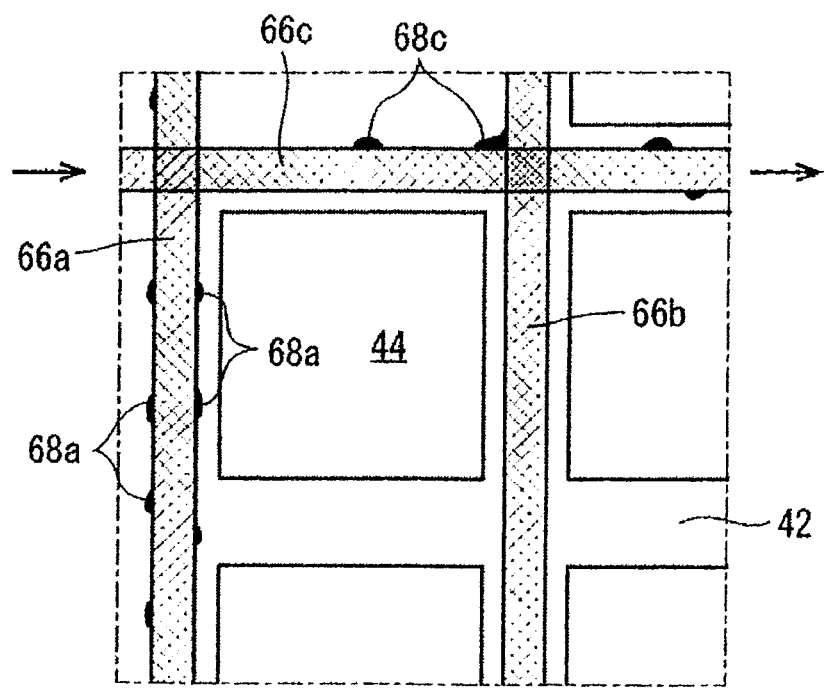
FIG. 5B is an enlarged view of a part C in FIG. 5A.

After the second chipping data is recorded, third chipping data of a cut groove formed by cutting the wafer 40 from a second direction intersecting the first direction is recorded in the recording means. In the present embodiment, the orientation flat 46 is positioned on the right side of FIG. 5A by rotating the wafer 40 counterclockwise from the position depicted in FIG. 3A by 90 degrees as viewed from above the paper plane of FIG. 3A, and a cut groove 66*c* is formed by cutting the wafer 40 from the left side to the right side of FIG. 5A. Next, a region including the cut groove 66*c* formed on the top surface 40*a* of the wafer 40 is imaged by the imaging unit 28, and chipping data (third chipping data) of the imaged cut groove 66*c* is recorded in the recording means as depicted in FIG. 7. An example of chippings occurring when the cut groove 66*c* is formed is denoted by reference sign 68*c* in FIG. 5B.

Figure 6A:
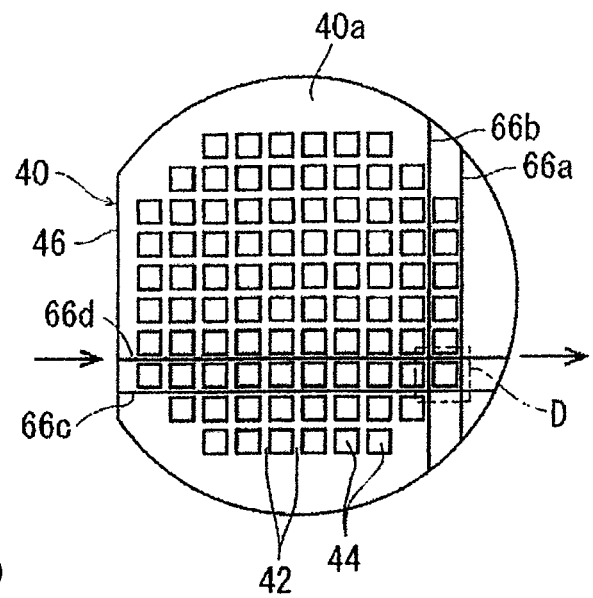
FIG. 6A is a plan view of the wafer in which a cut groove is further formed by cutting the wafer depicted in FIG. 5A from a direction opposite from the second direction.
Figure 6B:
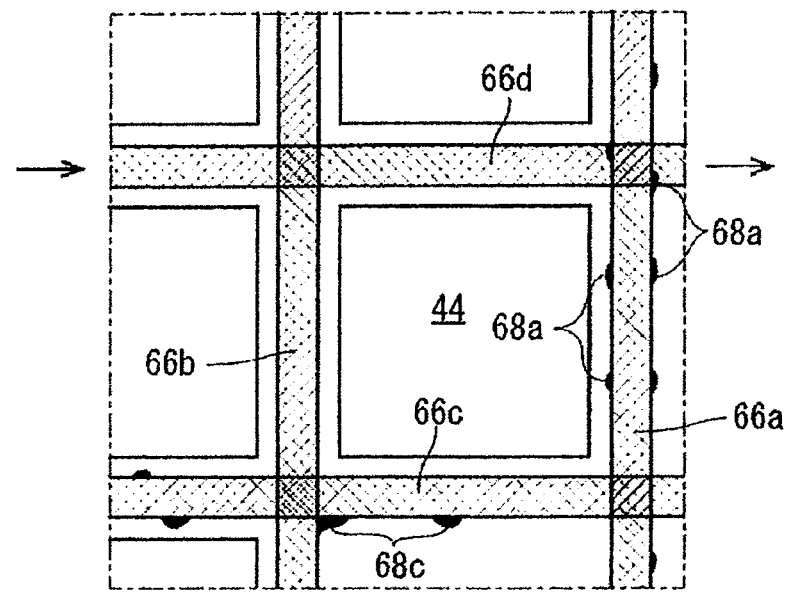
FIG. 6B is an enlarged view of a part D in FIG. 6A.
Figure 8:
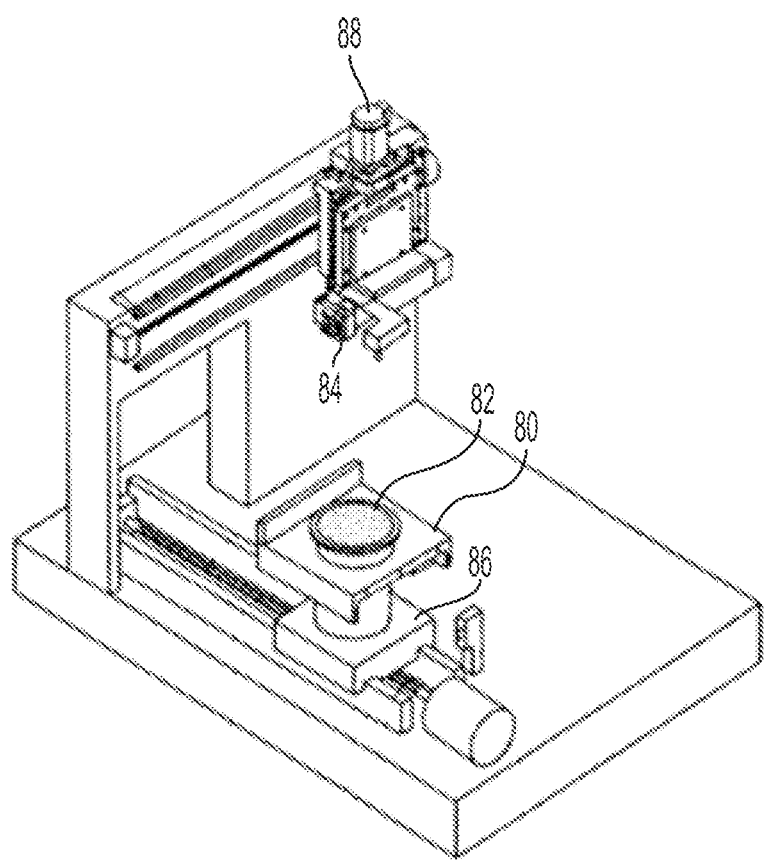
FIG. 8 is a perspective view of a known cutting apparatus.

After the third chipping data is recorded, fourth chipping data of a cut groove formed by cutting the wafer 40 from a direction opposite from the second direction is recorded in the recording means. In the present embodiment, the orientation flat 46 is positioned on the left side of FIG. 6A by rotating the wafer 40 clockwise from the position depicted in FIG. 3A by 90 degrees as viewed from above the paper plane of FIG. 3A, and a cut groove 66*d* is formed by cutting the wafer 40 from the left side to the right side of FIG. 6A. Next, a region including the cut groove 66*d* formed on the top surface 40a of the wafer 40 is imaged by the imaging unit 28, and chipping data (fourth chipping data) of the imaged cut groove 66d is recorded in the recording means as depicted in FIG. 7. In the present embodiment, as depicted in FIG. 6B, no chipping occurs when the cut groove 66d is formed.

After the first to fourth chipping data is recorded, directions in which to form cut grooves in the cutting processing are determined by comparing the first to fourth chipping data recorded in the recording means. The determination of the directions in which to form cut grooves is made by the determining means of the cutting apparatus 2 in the present embodiment. However, the determination of the directions in which to form cut grooves may be made by an operator. The operator can determine the directions in which to form cut grooves by displaying the first to fourth chipping data by the display means 38, or outputting (printing or the like) the first to fourth chipping data in a table format depicted in FIG. 7 by the output means.

Describing the determination of the directions in which to form cut grooves in the present embodiment, first, a comparison between the first chipping data of the cut groove 66a formed by cutting the wafer 40 from the first direction and the second chipping data of the cut groove 66b formed by cutting the wafer 40 from the direction opposite from the first direction indicates that chippings occur on both sides of the cut groove 66a, and that no chipping occurs on either side of the cut groove 66b. Therefore, for a direction parallel with the orientation flat 46, the opposite direction from the first direction is determined as a direction in which to form cut grooves.

In addition, as for a direction perpendicular to the orientation flat 46, a comparison between the third chipping data of the cut groove 66c formed by cutting the wafer 40 from the second direction and the fourth chipping data of the cut groove 66d formed by cutting the wafer 40 from the direction opposite from the second direction indicates that chippings occur on both sides of the cut groove 66c, and that no chipping occurs on either side of the cut groove 66d. Therefore, the opposite direction from the second direction is determined as a direction in which to form cut grooves.

When the chipping data is compared, a direction in which there is a small quantity of chippings is basically determined as a direction in which to form cut grooves. However, from a viewpoint of an effect on the transverse rupture strength of device chips or the like, a direction in which small-sized chippings are formed even when there is a large quantity of chippings is determined as a direction in which to form cut grooves. For example, in a case where five chippings smaller than 5 μm are formed in the first direction, and three chippings equal to or larger than 10 μm are formed in the opposite direction from the first direction, the first direction is determined as a direction in which to form cut grooves.

As described above, the cutting apparatus 2 according to the present embodiment can determine directions in which to form cut grooves by comparing the first to fourth chipping data. Thus, device chips of excellent quality with few chippings can be produced by cutting the wafer 40 from the appropriate directions.

Incidentally, in the present embodiment, the respective regions including the cut grooves 66a to 66d formed on the top surface 40a of the wafer 40 are imaged by the imaging unit 28, and the first to fourth chipping data is recorded in the recording means. However, in addition to such chipping data of the top surface 40a side, undersurface chipping data of the undersurface 40b side of the wafer 40 may be recorded in the recording means.

Making detailed description, the imaging unit 28 may be focused on the undersurface 40b of the wafer 40 whose undersurface is oriented downward, the respective regions of the cut grooves 66a to 66d on the undersurface 40b of the wafer 40 may be imaged by the imaging unit 28 by light having a wavelength passing through the wafer 40 (for example, infrared rays), and the following undersurface chipping data may be recorded in the recording means: first undersurface chipping data of the undersurface 40b side of the cut groove 66a; second undersurface chipping data of the undersurface 40b side of the cut groove 66b; third undersurface chipping data of the undersurface 40b side of the cut groove 66c; and fourth undersurface chipping data of the undersurface 40b side of the cut groove 66d. Then, directions in which to form cut grooves may be determined by comparing the first to fourth undersurface chipping data of the undersurface 40b side of the wafer 40 in addition to the first to fourth chipping data of the top surface 40a side of the wafer 40.

Incidentally, an imaging unit used by aligning means that detects a region to be cut before the wafer 40 is cut preferably doubles as the imaging unit 28.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus comprising:
   a chuck table having a holding surface holding a workpiece;
   a cutting unit having a rotatable cutting blade that cuts the workpiece held on the chuck table;
   a cutting water supplying mechanism that supplies cutting water to the cutting blade and the workpiece;
   a processing feed mechanism that processing-feeds the chuck table and the cutting unit relative to each other in an X-axis direction parallel with the holding surface;
   an indexing feed mechanism that indexing-feeds the chuck table and the cutting unit relative to each other in a Y-axis direction parallel with the holding surface and orthogonal to the X-axis direction; and
   a processing feed direction determining mechanism;
   the processing feed direction determining mechanism including an imaging unit that images a region including a cut groove and recording means recording chipping data of the imaged cut groove, and
   the recording means recording first chipping data of a cut groove formed by cutting the workpiece from a first direction, second chipping data of a cut groove formed by cutting the workpiece from a direction opposite from the first direction, third chipping data of a cut groove formed by cutting the workpiece from a second direction intersecting the first direction, and fourth chipping data of a cut groove formed by cutting the workpiece from a direction opposite from the second direction,
   wherein
   the processing feed determining mechanism includes determining means, and
   the determining means determines a direction in which to form a cut groove by comparing the first chipping data, the second chipping data, the third chipping data, and the fourth chipping data recorded in the recording means.

2. A cutting apparatus comprising:
a chuck table having a holding surface holding a workpiece;
a cutting unit having a rotatable cutting blade that cuts the workpiece held on the chuck table;
a cutting water supplying mechanism that supplies cutting water to the cutting blade and the workpiece;
a processing feed mechanism that processing-feeds the chuck table and the cutting unit relative to each other in an X-axis direction parallel with the holding surface;
an indexing feed mechanism that indexing-feeds the chuck table and the cutting unit relative to each other in a Y-axis direction parallel with the holding surface and orthogonal to the X-axis direction; and
a processing feed direction determining mechanism;
the processing feed direction determining mechanism including an imaging unit that images a region including a cut groove and recording means recording chipping data of the imaged cut groove, and
the recording means recording first chipping data of a cut groove formed by cutting the workpiece from a first direction, second chipping data of a cut groove formed by cutting the workpiece from a direction opposite from the first direction, third chipping data of a cut groove formed by cutting the workpiece from a second direction intersecting the first direction, and fourth chipping data of a cut groove formed by cutting the workpiece from a direction opposite from the second direction,
wherein
the imaging unit images a cut groove formed on an undersurface of the workpiece by light having a wavelength passing through the workpiece, and
the recording means records first undersurface chipping data of an undersurface side of the cut groove formed by cutting the workpiece from the first direction, second undersurface chipping data of an undersurface side of the cut groove formed by cutting the workpiece from the direction opposite from the first direction, third undersurface chipping data of an undersurface side of the cut groove formed by cutting the workpiece from the second direction orthogonal to the first direction, and fourth undersurface chipping data of an undersurface side of the cut groove formed by cutting the workpiece from the direction opposite from the second direction,
wherein further
the processing feed determining mechanism includes determining means, and
the determining means determines a direction in which to form a cut groove by comparing the first undersurface chipping data, the second undersurface chipping data, the third undersurface chipping data, and the fourth undersurface chipping data in addition to the first chipping data, the second chipping data, the third chipping data, and the fourth chipping data recorded in the recording means.

3. The cutting apparatus according to claim 2, wherein
the processing feed determining mechanism includes at least one of display means displaying the chipping data and output means outputting the chipping data.

4. The cutting apparatus according to claim 2, wherein
the chipping data includes size and quantity of chippings.

5. The cutting apparatus according to claim 4, wherein
the chipping data includes an image.

* * * * *